(12) United States Patent
Yu et al.

(10) Patent No.: US 8,550,416 B2
(45) Date of Patent: Oct. 8, 2013

(54) MOUNTING APPARATUS FOR SLIDE RAIL

(75) Inventors: Mo-Ming Yu, Shenzhen (CN); Ze-Hong Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 187 days.

(21) Appl. No.: 13/070,462

(22) Filed: Mar. 23, 2011

(65) Prior Publication Data
US 2012/0193489 A1   Aug. 2, 2012

(30) Foreign Application Priority Data
Jan. 28, 2011   (CN) .......................... 2011 1 0031153

(51) Int. Cl.
*A47F 5/00* (2006.01)
*A47H 1/10* (2006.01)

(52) U.S. Cl.
USPC ...................................... 248/298.1; 248/241

(58) Field of Classification Search
USPC ......... 248/298.1, 235, 241, 224.51, 244, 250, 248/224.61; 361/724, 725, 726, 727, 361/679.37, 679.38, 679.39; 292/216; 312/319.1, 334.4, 334.5
See application file for complete search history.

(56) References Cited

U.S. PATENT DOCUMENTS

| 7,703,734 B2 * | 4/2010 | Chen et al. ................. 248/298.1 |
| 7,878,468 B2 * | 2/2011 | Chen et al. ............... 248/220.41 |
| 2009/0261699 A1 * | 10/2009 | Yu et al. .................... 312/334.46 |

* cited by examiner

*Primary Examiner* — Terrell McKinnon
*Assistant Examiner* — Eret McNichols
(74) *Attorney, Agent, or Firm* — Altis & Wispro Law Group, Inc.

(57) ABSTRACT

A fixing apparatus includes a mounting bracket secured to a slide rail, a latch member, and a holding member. The mounting bracket includes an inserting pin extending into a through hole of a rack post. The latch member includes a slide bracket, and a positioning pin forming a plurality of abutting blocks stacked up one by one. A rear end of the holding member is secured to the mounting bracket, and includes a retaining portion extending forwards. The latch member is slidable between a locking position to prevent the inserting pin from being disengaged from the through hole of the rack post, and an unlocking position to enable the insert pin to slide out of the through hole of the rack post. the retaining portion of the holding member is selectively abuts against one of the abutting blocks of positioning pin to prevent the latch member from sliding towards the unlocking position.

8 Claims, 5 Drawing Sheets

MOUNTING APPARATUS FOR SLIDE RAIL

BACKGROUND

1. Technical Field

The present disclosure relates to mounting apparatuses and, more particularly, to a mounting apparatus for a slide rail.

2. Description of the Related Art

A rackable server system includes a rack and a plurality of servers slidably mounted to the rack with a plurality of slide rail assemblies. Each of the slide rail assemblies includes two mounting apparatus at opposite ends of the slide rail assembly for fixing the slide rail assembly to opposite supporting posts of the rack. However, each of the mounting apparatuses is designed for a kind of particular-sized supporting posts. Therefore, the slide rail assembly cannot be fixed to differently-sized supporting posts.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
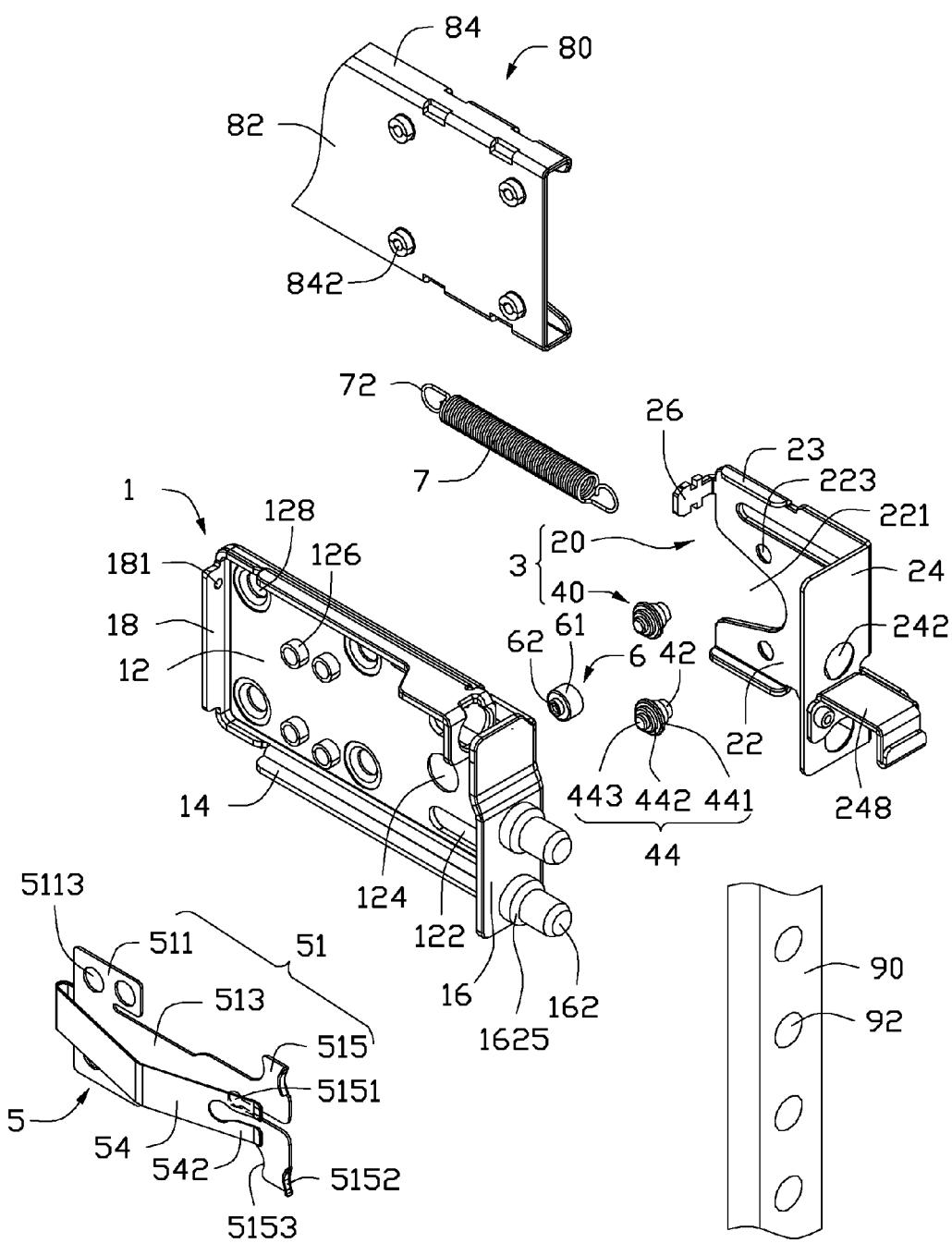
FIG. 1 is an exploded, isometric view of an embodiment of a mounting apparatus, a slide rail, and a supporting post of a rack, the mounting apparatus including a supporting bracket, a latch member, a holding member, a button, and a resilient member.
Figure 2:
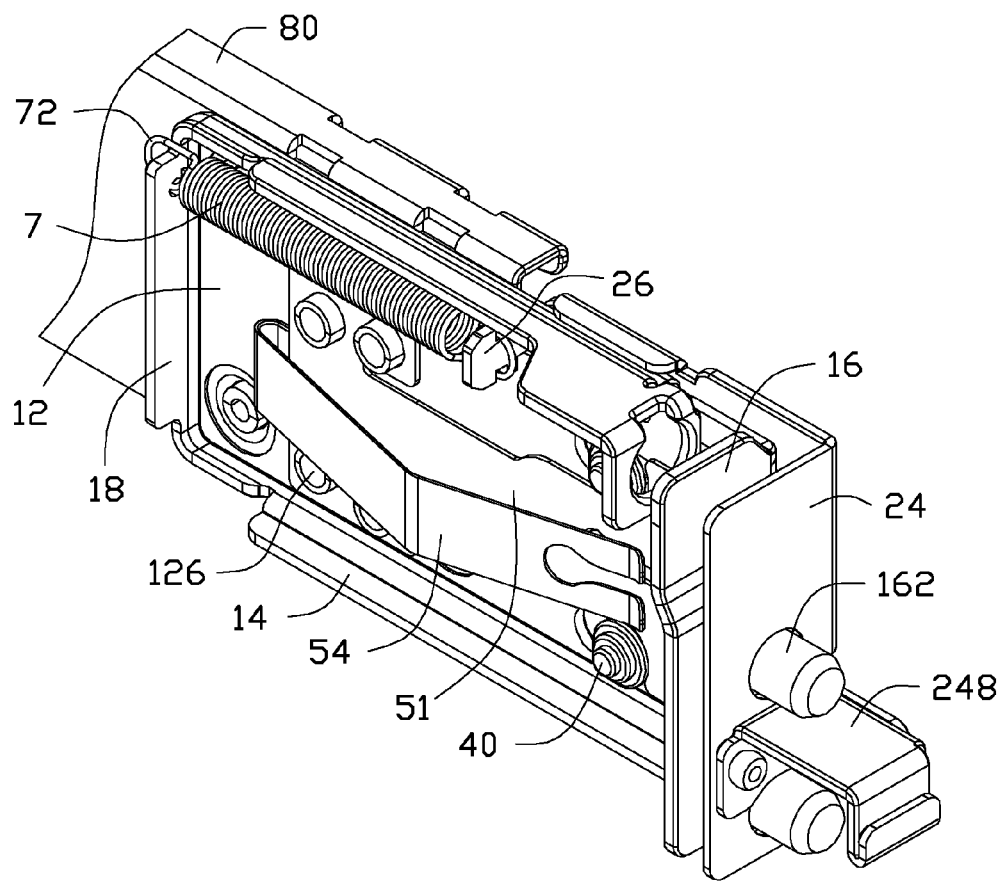
FIG. 2 is an assembled, isometric view of the mounting apparatus and the slide rail of FIG. 1.

Referring to FIG. 1, an embodiment of a mounting apparatus is provided for mounting a slide rail 80 to a rack post 90 defining a plurality of through holes 92. The mounting apparatus includes a supporting bracket 1, a latch member 3, a holding member 5, a button 6, and a resilient member 7.

The slide rail 80 defines a substantially C-shaped cross section, and includes a web 82 with two flanges 84 extending from upper and lower sides of the web 82, respectively. The web 82 forms a plurality of fixing pins 842 extending from an outer surface of the web 82.

The supporting bracket 1 includes a sidewall 12, two flanges 14 perpendicularly extending from upper and lower sides of the sidewall 12, an end plate 16 perpendicularly extending from a front end of the sidewall 12, and an engaging tab 18 perpendicularly extending from a rear end of the sidewall 12. The sidewall 12 defines two parallel first slide slots 122 extending in a longitudinal direction of the sidewall 12, adjacent to the end plate 16, and a second slide slot 123 (shown in FIG. 3) extending substantially parallel to the first slide slots 122, and arranged at a top side of the first slide slots 122. A through hole 124 is defined in the sidewall 122, between the first slide slots 122. A plurality of fixing holes 128 is defined in the sidewall 12, adjacent to the engaging tab 18. A plurality of fixing pins 126 protrudes from an outer surface of the sidewall 12, and arranged in an area bounded by the plurality of fixing holes 128. Two inserting pins 162 extend forward from the end plate 16 of the supporting bracket 10. Each of the inserting pins 162 includes a first inserting segment extending from the end plate 16, and a second inserting segment extending from the first inserting segment. A shoulder 1625 is formed at a distal end of the first inserting segment, facing the second inserting segment. An engaging hole 181 is defined in the engaging tab 18.

The latch member 3 includes a slide bracket 20 and two positioning pins 40. The slide bracket 20 includes a side panel 22, two flanges 23 extending outwards from upper and lower sides of the side panel 22, a blocking plate 24 perpendicularly extending from a front end of the side panel 22, and an engaging tab 26 extending from a rear end of the side panel 22. A substantially arc-shaped opening 221 is defined in the rear end of the side panel 22. Two positioning holes 223 are defined in the side panel 22, near upper and lower sides of the opening 221, respectively. The blocking plate 24 defines two through holes 242 therein. A handle 248 extends forward from the blocking plate 24. Each of the positioning pins 40 includes an abutting portion 44, and a mounting portion 42. The abutting portion 44 includes a first abutting block 441, a second abutting block 442, and a third abutting block 443 stacked up one by one. The first, second, and third abutting blocks 441, 442, and 443 are disc-shaped. A diameter of the second abutting block 442 is smaller than a diameter of the first abutting block 441, and greater than a diameter of the third abutting block 443.

The holding member 5 is a metal sheet, which is bent to form a holding plate 51 and a pressing tab 54. The holding plate 51 includes a mounting portion 511, an elongated portion 513 extending from a front end of the mounting portion 511, and two substantially L-shaped retaining portions 515 extending from a front end of the elongated portion 513. A plurality of securing holes 5113 is defined in the mounting portion 511. A connecting hole 5151 is defined in the elongated portion 513, between the retaining portions 515. Each of the retaining portions 515 forms a forward side 5152, and a rearward side 5153 opposite to the forward side 5152 and facing the mounting portion 511. The pressing tab 54 extends forward from a rear end of the mounting portion 511, and includes two spaced pressing portions 542 elastically resisting against the retaining portions 515, respectively.

The button 6 includes a cylindrical main body 61 with a diameter smaller than the through hole 124 of the supporting bracket 1, and a fixing portion 62 extending from an end of the main body 61.

In one embodiment, the resilient member 7 is a coil spring, with two hooks 72 correspondingly formed at opposite ends of the resilient member 7.

Referring to FIGS. 2 to 4A, in assembly, the button 6 is mounted to a side of the holding plate 51 opposite to the pressing tab 54, with the fixing portion 62 of the button 6 fixed in the connecting hole 5151 of the holding plate 51. The holding member 5 is mounted to the supporting bracket 1, with the fixing pins 126 of the supporting bracket 1 fixed in the securing holes 5113 of the holding member 30. The main body 61 of the button 6 extends through the through hole 124 of the sidewall 12 of the supporting bracket 1. The slide bracket 20 of the latch member 3 is slidably coupled to the supporting bracket 1, with the engaging tab 26 slidably engaged in the second slide slot 123. The mounting portions 42 of the positioning pins 40 extend through the corresponding first slide slots 122 of the supporting bracket 1 and are retained in the corresponding positioning holes 223 of the slide bracket 20. Therefore, the positioning pins 40 are fixed to the slide bracket 20, and slidably engaged with the supporting bracket 1. One of the hooks 72 of the resilient member 7 is engaged in the engaging hole 181 of the engaging tab 18 of the supporting bracket 1, and the other hook 72 is engaged with the engaging tab 26 of the slide bracket 20. In an initial status, the slide bracket 20 is located in a position to make the fixing pins 126 extend into the through holes 242 of the blocking plate 24 of the slide bracket 20. The positioning pins 40 are located behind the retaining portions 515 of the holding member 5.

The mounting apparatus is installed to the slide rail 80, with the protrusions 842 of the slide rail 80 correspondingly fixed in the fixing holes 128 of the supporting bracket 1.

Figure 3:
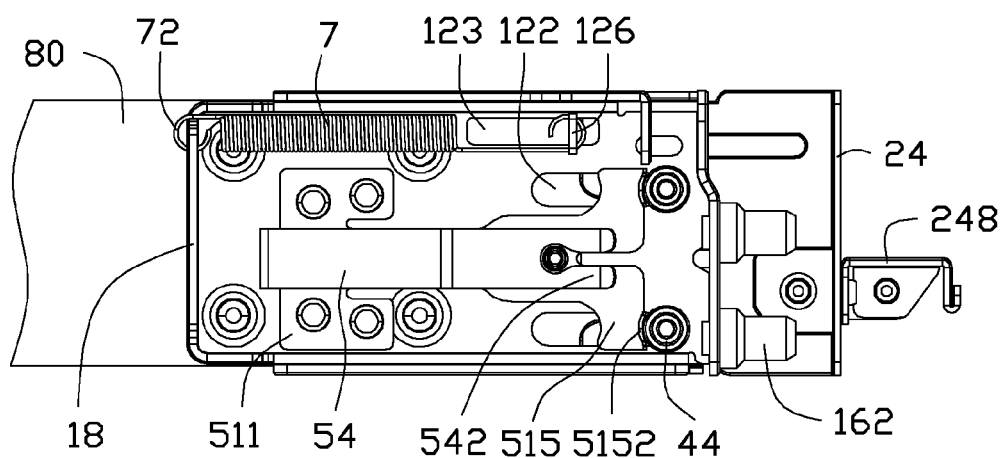
FIGS. 3 and 4A are side plan views of FIG. 2, respectively showing the latch member in unlocked and locked positions.

Referring to FIG. 3, to mount the slide rail 80 to the rack post 90, the main body 61 of the button 6 is pushed to move the retaining portions 515 of the holding member 5 away from the sidewall 12 of the supporting bracket 1, until the retaining portions 515 disengage from the corresponding positioning pins 40. Therefore, the positioning pins 40 are capable of sliding forward along the corresponding first slide slots 122. The handle 248 is operated to pull the slide bracket 20 forward, the positioning pins 40 move with the slide bracket 20 toward the front end of the corresponding first slide slots 122 of the supporting bracket 1. The resilient member 7 is deformed. The blocking plate 24 of the slide bracket 20 moves away from the end plate 16 of the supporting bracket 1 to make the inserting pins 162 disengage from the corresponding through holes 242 of the blocking plate 24. The button 6 is released, the holding member 5 is restored to make the holding plate 51 tightly abut against the sidewall 12 of the supporting bracket 1. The handle 248 is released. The resilient member 7 is restored to pull the slide bracket 20 backwards until the positioning pins 40 abut against the forward sides 5152 of the corresponding retaining portions 515 of the holding plate 51. Therefore, the latch member 3 is kept in an unlocked position, ready for engaging with the rack post 90.

Figure 4A:
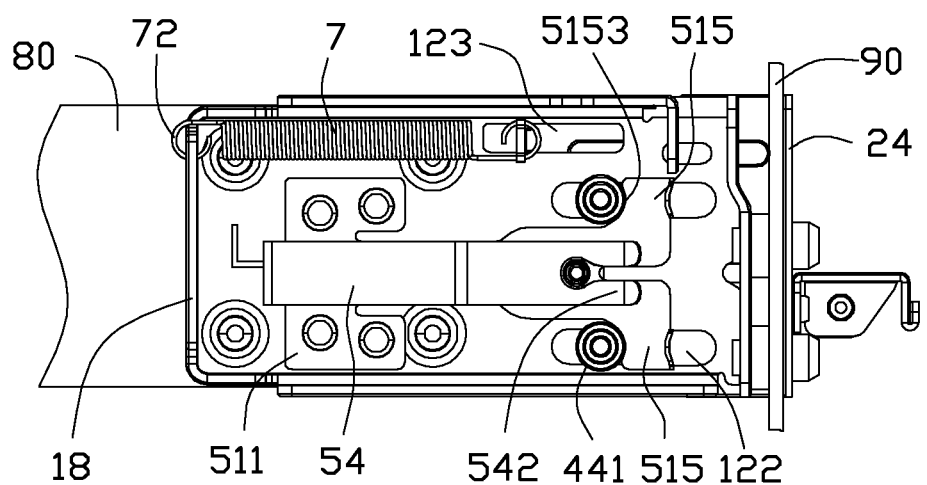

Referring to FIG. 4A, the slide rail 80 is handled to make the inserting pins 162 insert into the corresponding through holes 92 of the rack post 90, until the shoulders 1625 of the inserting pins 162 abut against, a rear surface of the rack post 90. The button 6 is pushed to move the retaining portions 515 of the holding plate 51 away from the sidewall 12 of the supporting bracket 1 to disengage the holding member 5 from the positioning pins 40. The resilient member 7 is restored to slide the slide bracket 20 backwards, until the blocking plate 24 abuts against a front surface of the rack post 90 to tightly sandwich the rack post 90 between the blocking plate 24 and the shoulders 1625 of the inserting pins 162. At the same time, the positioning pins 40 slide with the slide bracket 20 along the corresponding first slide slots 122 of the supporting bracket 1 to approach to the rear ends of the first slide slots 122. The button 6 is released, the holding member 5 is restored. The retaining portions 515 of the holding plate 51 move towards the sidewall 12 of the supporting bracket 1. in one embodiment, the rearward sides 5153 of the retaining portions 515 abut against the third abutting blocks 441 of the corresponding positioning pins 40 to keep the slide bracket 20 in a locked position where the slide rail 80 is retained to the rack post 90 by the mounting apparatus.

Figure 4B:
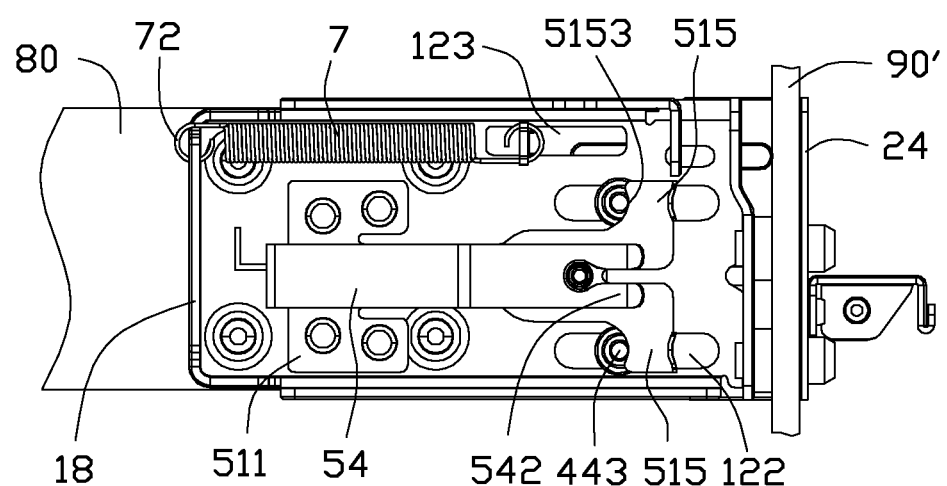
FIG. 4B is similar to FIG. 4A, but showing the mounting apparatus locked to another rack post.

Referring to FIG. 4B, when the slide rail 80 is mounted to another rack post 90' having a thickness greater than that of the rack post 90 of FIG. 4A, the rearward sides 5153 of the retaining portions 515 will abut against the first abutting blocks 442 or the second abutting blocks 443 of the corresponding positioning pins 40 to keep the slide bracket 20 in the locked position and increase the distance between the blocking plate 24 and the end plate 16 corresponding to thickness of the another rack post 90'. Therefore, the mounting apparatus can fix the slide rail 80 to different-sized rack posts.

When the slide rail 80 is mounted to another rack post greater than the rack post 90, the rearward sides 5153 of the retaining portions 515 will abut against the first abutting blocks 442 or the second abutting blocks 443 of the corresponding positioning pins 40 to keep the slide bracket 20 in the locked position. Therefore, the mounting apparatus can fix the slide rail 80 to different-sized supporting posts.

It is believed that the present embodiment and its advantages will be understood from the foregoing description, and it will be apparent that various changes may be made thereto without departing from the spirit and scope of the description or sacrificing all of its material advantages, the examples hereinbefore described merely being exemplary embodiments.

What is claimed is:

1. A mounting apparatus for mounting a slide rail to a rack post, the rack post defining a through hole, the mounting apparatus comprising:
   a supporting bracket fixed to the slide rail, the supporting bracket comprising an end plate and an inserting pin extending from the end plate to extend through the through hole of the rack post;
   a latch member comprising a slide bracket slidably coupled to the supporting bracket, and a positioning pin secured to the slide bracket, the slide bracket comprising a blocking plate parallel and aligned with the end plate of the supporting bracket, the positioning pin comprising a plurality of abutting blocks stacked up one by one and having different distances relative to the blocking plate; and
   a holding member comprising a mounting portion fixed to the supporting bracket, an elongated portion extending from a front end of the mounting portion, and a retaining portion extending from a front end of the elongated portion, the retaining portion forming a rearward side facing the mounting portion;
   wherein the latch member is operable to slide between a locking position where the blocking plate of the latch member abuts against a side of the rack post opposite to the end plate of the supporting bracket to prevent the inserting pin from disengaging from the through hole of the rack post, and an unlocking position where the blocking plate of the latch member moves away from the rack post to enable the inserting pin to disengage from the through hole of the rack post; the retaining portion of the holding member selectively abuts against one of the abutting blocks of the positioning pin to keep the latch member at the locking position, and the retaining portion selectively abuts against one of the abutting blocks of the positioning pin to keep different distances between the blocking plate of the slide bracket and the end plate of the supporting bracket to sandwich rack posts of different thicknesses.

2. The mounting apparatus of claim 1, wherein the abutting blocks of the positioning pin are disc-shaped and have different diameters.

3. The mounting apparatus of claim 2, further comprising a resilient member connected between the supporting bracket and the latch member to bias the latch member to the locking position.

4. The mounting apparatus of claim 3, wherein the resilient member is a coil spring comprising two hooks at opposite ends of the resilient member, the hooks of the resilient member respectively engage with the supporting bracket and the latch member.

5. The mounting apparatus of claim 2, wherein the retaining portion of the holding member further forms a forward side to abut against the positioning pin to keep the latch member in the unlocking position.

6. The mounting apparatus of claim 5, wherein the supporting bracket defines a slide slot extending along a sliding direction of the latch member, the positioning pin extends through the slide slot.

7. The mounting apparatus of claim 2, wherein the holding member further comprises a pressing tab extending from the mounting portion of the holding member to resist against the retaining portion of the holding member and urge the retaining portion towards the supporting bracket.

8. The mounting apparatus of claim 7, further comprising a button attached to the holding member and extending away from the pressing tab.

\* \* \* \* \*